United States Patent [19]

Yamashita et al.

[11] 4,315,333
[45] Feb. 9, 1982

[54] CIRCUIT ARRANGEMENT FOR A WIDE-BAND VHF-UHF TELEVISION DOUBLE SUPERHETERODYNE RECEIVER

[75] Inventors: Sadahiko Yamashita; Hiroshi Onishi; Mitsuo Saito; Morikazu Sagawa, all of Kawasaki, Japan

[73] Assignee: Matsushita Electric Industrial Company, Limited, Osaka, Japan

[21] Appl. No.: 143,809

[22] Filed: Apr. 23, 1980

[30] Foreign Application Priority Data

Apr. 26, 1979 [JP] Japan .................................. 54-52089

[51] Int. Cl.³ .............................................. H04B 1/26
[52] U.S. Cl. .................................. 455/189; 455/207; 455/315
[58] Field of Search .................... 455/315, 316, 20, 21, 455/189, 190, 207, 209, 326, 327, 330, 331, 333, 314; 333/204, 206

[56] References Cited

U.S. PATENT DOCUMENTS

| | | | |
|---|---|---|---|
| 2,814,780 | 11/1957 | Edwards | 455/331 |
| 3,119,067 | 1/1964 | Wohlenberg et al. | 455/314 |
| 3,427,573 | 2/1969 | Birdsall et al. | 333/206 |
| 3,550,011 | 12/1970 | Dubowicz et al. | 455/314 |
| 3,566,315 | 2/1971 | Vinding | 333/204 |
| 3,909,755 | 9/1975 | Kaunzinger | 333/206 |
| 3,939,429 | 2/1976 | Löhn et al. | 455/315 |
| 3,961,262 | 6/1976 | Gassmann | 455/207 |

Primary Examiner—Marc E. Bookbinder
Attorney, Agent, or Firm—Lowe, King, Price & Becker

[57] ABSTRACT

The signal transmission lines in a double conversion stage for a double superheterodyne VHF-UHF television receiver are mainly constructed of unbalanced circuits rather than balanced circuits. The circuit arrangement comprises a wide-band amplifier for receiving the incoming carrier frequency, first and second frequency conversion stages, and an intermediate frequency amplifying stage, connections between the wide-band amplifier and the first frequency conversion stage, as well as connections between the second frequency conversion stage and the intermediate frequency amplifying stage are achieved by means of unbalanced circuits. Each of the first and second frequency conversion stages comprises a mixer constructed of a single balanced circuit, a local oscillator and an unbalanced/balanced conversion circuit interposed therebetween. A filter means, having a band-pass filter, and a low-pass filter interposed between the first and second frequency conversion stages effectively blocks spurious signals.

6 Claims, 2 Drawing Figures

CIRCUIT ARRANGEMENT FOR A WIDE-BAND VHF-UHF TELEVISION DOUBLE SUPERHETERODYNE RECEIVER

FIELD OF THE INVENTION

This invention generally relates to a wide-band superheterodyne receiver. More particularly, the present invention relates to a wide-band superheterodyne receiver in which a first intermediate frequency is higher than the incoming carrier frequency, and a second intermediate frequency is lower than the first intermediate frequency.

BACKGROUND OF THE INVENTION

Double superheterodyne receivers are often used as wide or broad band receivers. An input carrier frequency is changed twice in such a receiver. There are basically two ways for effecting such double conversion in a double superheterodyne receiver. According to the first method the incoming carrier frequency, which may include an audio or video signal, is lowered to a first intermediate (IF) frequency value by being mixed with a first local oscillator frequency in a first mixer. The first IF is reduced to a second IF value by being mixed with a second local oscillator frequency in a second mixer. On the other hand, according to the second method the incoming carrier frequency is increased by a first mixer so as to be out of the receiving range, and the increased frequency is then lowered by a second mixer.

The present invention relates to a double superheterodyne receiver in which the latter method is adopted. One example of such a double conversion superheterodyne receiver is disclosed in a U.S. Pat. No. 3,939,429. In a double superheterodyne receiver as disclosed in the above mentioned patent, the incoming carrier frequency is first amplified by a wide-band high frequency amplifier and then converted twice in first and second mixers prior to being applied to an IF amplifying stage. The mixers are constructed of double balanced systems. Transmission lines between the high frequency amplifier and the IF amplifying stage are constructed of balanced circuits. Furthermore, a band-pass filter connected between the first and second mixers comprises a magnetic resonance circuit, such as a YIG device. According to the technique of the above mentioned patent, the circuitry is complex in construction since significant a number of balanced circuits is required. Furthermore, the band-pass filter has to be equipped with an external circuit for compensating for temperature variation, resulting in further complex construction. Such a complex construction of circuitry necessarily requires a number of elements, whereby the receiver is apt to be bulky and relatively high in cost.

SUMMARY OF THE INVENTION

The present invention has been developed in order to remove the above mentioned disadvantages and drawbacks inherent in conventional wide-band double superheterodyne receivers.

It is, therefore, a primary object of the present invention to provide a new and useful circuit arrangement for a wide-band double superheterodyne receiver, which circuit arrangement is simple in construction.

Another object of the present invention is to provide a circuit arrangement for a wide-band superheterodyne receiver, which circuit arrangement is mainly constructed of unbalanced circuits rather than balanced circuits.

A further object of the present invention is to provide such a circuit arrangement having a filter means between first and second mixers, which filter means may be simply constructed of coaxial circuits, microstrips or the like.

In accordance with the present invention there is provided a double superheterodyne receiver circuit arrangement for a wide-band VHF-UHF TV channel including audio and video modulation signals. The circuit arrangement includes (a) a wide-band VHF-UHF amplifier responsive to an incoming carrier frequency; (b) a first local oscillator; (c) a first mixer responsive to the output signal of the wide-band amplifier and to the output signal of the first local oscillator for producing a first intermediate frequency which is greater than at least twice the upper limit of the incoming carrier frequency; (d) filter means, including a band-pass filter and a low-pass filter responsive to the first intermediate frequency; (e) a second local oscillator; (f) a second mixer responsive to the output signal of the filter means and to the output signal of the second local oscillator for producing a second intermediate frequency; (g) an intermediate frequency amplifying stage responsive to the output signal of the second mixer for amplifying the second intermediate frequency; and (h) a plurality of unbalanced transmission lines for effecting the respective connections between the wide-band VHF-UHF amplifier and the first mixer, between the first mixer and the filter means, between the band-pass filter and the low-pass filter, between the filter means and the second mixer, and between the second mixer and the intermediate frequency amplifying stage.

BRIEF DESCRIPTION OF THE DRAWINGS

These and other objects and features of the present invention will become more readily apparent from the following detailed description of the preferred embodiment taken in conjunction with the accompanying drawings in which.

DETAILED DESCRIPTION OF THE PREFERRED EMBODIMENT

Prior to describing the embodiment of the present invention, a conventional circuit arrangement will be discussed in order to make the objects and features of the present invention clear.

Figure 1:
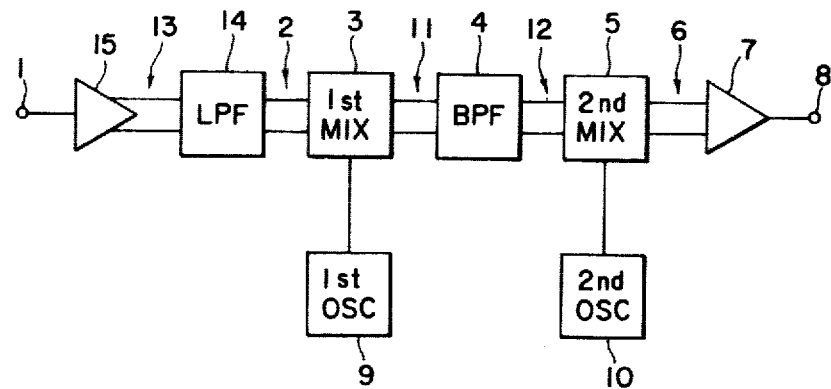
FIG. 1 is a block diagram of a conventional circuit arrangement for a wide-band double superheterodyne receiver.

FIG. 1 is an illustration of a conventional circuit arrangement which is disclosed in the aforementioned U.S. Pat. No. 3,939,429. According to this conventional technique the incoming carrier frequency applied to an input terminal 1 is fed via a wide-band amplifier 15 and a low-pass filter 14 to a first mixer 3. The first mixer 3 is driven by a frequency from a first local oscillator 9 so that a first intermediate frequency (IF) is obtained at the output terminal of the first mixer 3. This first IF signal is applied via a band-pass filter 4, which permits the transmission of the first IF signal, to a second mixer 5. The second mixer 5 is driven by a frequency from a second local oscillator 10 to develop a second IF signal at the output terminal of the second mixer 5. This second IF signal is then amplified by an IF amplifying stage or amplifier 7 to be fed to an output terminal 8.

A given frequency signal among a number of incoming carrier signals is raised to the first IF value in the first mixer 3 by selecting the frequency from the first local oscillator 9. This first IF value is then lowered in the second mixer 5 to the second IF value. As mentioned hereinbefore the first and second mixers 3 and 5 are constructed of double balanced circuits, while all of the transmission lines from the wide-band amplifier 15 to the IF amplifier 7 are constructed of balanced circuits 2, 6, 11, 12 and 13 as shown by double lines in FIG. 1. The band-pass filter 4 is constructed of a magnetic resonance circuit, such as a YIG device. Due to the provision of such balanced circuits the circuit arrangement is complex in construction, requiring a number of elements.

The inventors of the present invention have made a circuit arrangement for a wide-band double superheterodyne receiver by using mainly unbalanced circuits as will be described hereinbelow. According to the present invention, to prevent spurious frequencies from influencing the final intermediate frequency, a low-pass filter is connected between first and second mixers so that spurious signals are prevented from being transmitted. In addition, in order to provide the whole signal transmission system with unbalanced circuits, two unbalanced/balanced conversion circuits are respectively interposed between the first mixer and the first local oscillator, and between the second mixer and the second local oscillator, while the mixers are constructed of single balanced circuits respectively. With this provision the number of semiconductor elements, for example in the wide-band amplifier and the mixers, can be reduced by one half compared to that in the conventional circuit arrangement.

Figure 2:
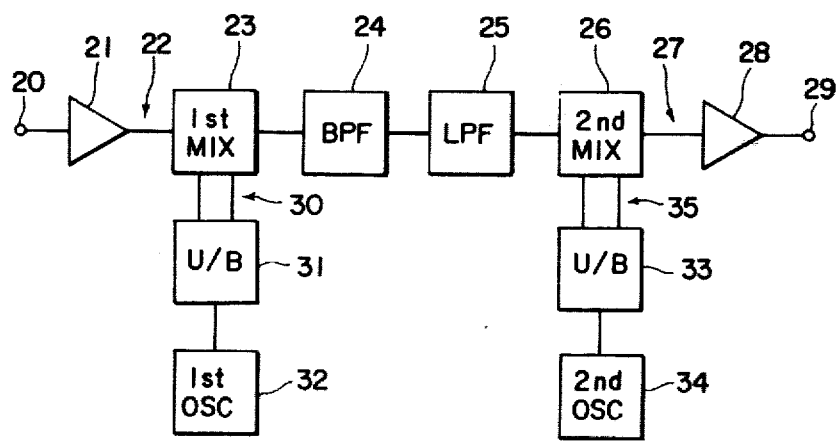
FIG. 2 is a block diagram of the circuit arrangement according to the present invention for a wide-band double superheterodyne receiver.

Reference is now made to FIG. 2, a schematic block diagram of the circuit arrangement according to the present invention. The circuit arrangement for a wide-band double superheterodyne receiver comprises a wide-band high frequency amplifier 21, first and second local oscillators 32 and 34, first and second unbalanced/balanced conversion circuits 31 and 33, first and second mixers 23 and 26, filter means including a band-pass filter 24 and a low-pass filter 25, and an intermediate frequency (IF) amplifier or stage 28.

The incoming VHF-UHF TV channel signal including audio and video modulation at input terminal 20 is coupled to an input terminal of wide-band VHF-UHF amplifier 21, having an output terminal of which is connected via an unbalanced circuit 22 to an input terminal of the first mixer 23. The first mixer 23 is also responsive to a frequency from the first local oscillator 32. The output signal of the first local oscillator 32 is first split into a balanced signal by the first unbalanced/balanced conversion circuit 31, and then the split balanced signal is fed to the first mixer 23 via a balanced circuit 30 which is shown in the form of double lines in FIG. 2. The first mixer is of single balanced type so that the first mixer 23 is capable of receiving the balanced signal. The first mixer 23 thus produces a first IF signal that is applied via the band-pass filter 24 and the low-pass filter 25 to an input terminal of the second mixer 26. The second mixer 26 is also responsive to a frequency from the second local oscillator 34. The output signal of the second local oscillator 34 is first split into a balanced signal by the second unbalanced/balanced conversion circuit 33, and then the split balanced signal from circuit 33 is fed to the second mixer 26 via a balanced circuit 35 which is also shown in the form of double lines. The second mixer 26, being of single balanced type, is capable of receiving the balanced signal from circuit 33. The second mixer 26 thus produces a second IF signal that is then applied via an unbalanced circuit 27 to an input terminal of the intermediate frequency amplifier 28 to be amplified therein. The amplified second IF signal is fed to the output terminal 29 to be delivered to the following stage, which includes a demodulator and an audio and video frequency amplifier.

In the illustrated embodiment, although the low-pass filter 25 to follows the band-pass filter 24, the position of the low-pass filter 25 may be changed if desired. Namely, the low-pass filter 25 may be connected to feed band-pass filter 24 while providing the same effect. Low-pass filter 25 eliminates spurious signals which are apt to pass through the band-pass filter 24 that is provided in the same manner as in the conventional system to eliminate spurious signals included in the first IF signal derived from the first mixer 23. Such spurious signals are produced in mixer by adding and subtracting the incoming frequency to and from integral multiples of the frequency of the signal derived from the first local oscillator 32. Although spurious signals having a frequency which is lower than three times the first intermediate frequency are readily eliminated by the band-pass filter 24, spurious signals having a frequency higher than that are apt to pass through the band-pass filter 24. In other words, the band-pass filter 24 does not effectively block such high frequency spurious signals. If it were assumed that the low-pass filter 25 of FIG. 1 were not provided, whereby the output terminal of the band-pass filter 24 is directly connected to the second mixer 26, the spurious signals which were not blocked by the band-pass filter 24 would be applied to the second mixer 26 so that these spurious signals might be mixed with high harmonics of the second local oscillator frequency. Accordingly, when such undesirable mixing is performed in the second mixer 26, spurious signals occur in the second intermediate frequency signal, resulting in undesirable interference. Therefore, low-pass filter 25 blocks the spurious signals developed at the output terminal of the first mixer 23.

The cutoff frequency of the low-pass filter 25 may be suitably selected. However, it is preferable to set the cutoff frequency to a value which is less than three times the possible lowest frequency from the first local oscillator 32 for the following reason. Namely, it is particularly necessary to block spurious singals which are produced from a frequency which equals three times the first local oscillator frequency inasmuch as the power of the signal having such a frequency is relatively great.

The present invention will be further described by reciting specific values of various frequencies and gains. These values, which have been obtained from experiments, of course do not restrict the scope of the invention. The wide-band amplifier 21 has a range of from 40 to 900 MHz, and a gain of 20 dB. The first local oscillator 32 is of voltage-tunable type, having a variable frequency from approximately 2,600 MHz to 3,400 MHz. Therefore, if the first IF value at the output of the first mixer 23 is set at 2,500 MHz, which is more than twice the upper limit of 900 MHz of amplifier 21 and the incoming carrier frequency it is preferable to set the cutoff frequency of the low-pass filter 25 at 7,000 MHz because 7,000 MHz is lower than the frequency which equals three times the possible lowest first local oscillator frequency. In order to receive TV broadcast waves, for instance in the United States, the frequency of the second local oscillator 34 is selected such that the second IF falls in 45 MHz band (58 MHz in Japan). With the circuit arrangement described hereinabove noise factors of less than 4 dB and 7 dB are respectively provided in the VHF and UHF bands as well as a total gain of 30 dB.

From the foregoing, it will be understood that the circuit arrangement according to the present invention is mainly constructed of unbalanced circuits to make the construction simple. Namely, transmission line 22 between the wide-band amplifier 21 and the first mixer 23 is an unbalanced circuit, while transmission line between 27 the second mixer 26 and the intermediate frequency amplifier 28 is an unbalanced circuit. The circuit arrangement is further simplified by using balanced mixers as the first and second mixers 23 and 26 and by utilizing unbalanced/balanced circuits 31 and 33 respectively between the first mixer 23 and the first local oscillator 32, and between the second mixer 26 and the second local oscillator 34. Since filter elements 24 and 25 between the first and second mixers 23 and 26 are unbalanced circuits, they can be of simple construction, such as coaxial type or microstrips. Consequently, the filters 24 and 25 may be readily constructed of microwave integrated circuits so that the size of the circuit arrangement may be remarkably reduced.

The present invention, therefore, provides a circuit arrangement having simple construction, for a wide-band VHF-UHF double conversion receiver enabling TV and/or radio broadcast signals to be easily received without switching the receiving bands. In addition, FM broadcast signals having a frequency band below the TV band, may be received by further broadening the receiving range. This means that the circuit arrangement according to the present invention is quite useful as home use wide-band receivers.

The above described embodiment is just an example of the invention, and therefore it will be apparent for those skilled in the art that many modifications and variations may be made without departing from the spirit of the instant invention.

What is claimed is:

1. A circuit arrangement for a wide-band VHF-UHF TV channel double superheterodyne receiver, comprising:

(a) a wide-band VHF-UHF amplifier responsive to an incoming carrier frequency of a TV channel signal in the VHF-UHF spectrum;
(b) a first local oscillator;
(c) a first mixer responsive to the output signal of said wide-band amplifier and to the output signal of said first local oscillator for producing a first intermediate frequency which is higher than at least twice the upper limit of said incoming carrier frequency;
(d) filter means including a band-pass filter and a low-pass filter, said filter means being responsive to said first intermediate frequency;
(e) a second local oscillator;
(f) a second mixer responsive to the output signal of said filter means and to the output signal of said second local oscillator for producing a second intermediate frequency;
(g) an intermediate frequency amplifying stage responsive to the output signal of said second mixer for amplifying said second intermediate frequency; and
(h) a plurality of unbalanced transmission lines for effecting the respective connections between said wide-band VHF-UHF amplifier and said first mixer, between said first mixer and said filter means, between said band-pass filter and said low-pass filter, between said filter means and said second mixer, and between said second mixer and said intermediate frequency amplifying stage.

2. A circuit arrangement as claimed in claim 1, wherein each of said first and second mixers comprises a single balanced circuit.

3. A circuit arrangement as claimed in claim 2, further comprising first and second unbalanced/balanced conversion circuits respectively interposed between said first local oscillator and said first mixer, and between said second local oscillator and said second mixer.

4. A circuit arrangement as claimed in claim 1, wherein the cutoff frequency of said low-pass filter is set to a frequency which is between twice and three times the lowest frequency of said first local oscillator.

5. The circuit arrangement of claim 1 or 2 or 3 or 4 wherein the TV channel signal has a frequency of from 40 to 900 MHz and the frequency of the first IF is approximately 2,500 MHz.

6. The circuit arrangement of claim 4 wherein the TV channel signal has a frequency of from 40 to 900 MHz and the frequency of the first IF is approximately 2,500 MHz and the low pass filter has a cut off frequency of approximately 7,000 MHz.

* * * * *